(12) United States Patent
Kumaki

(10) Patent No.: US 6,219,716 B1
(45) Date of Patent: Apr. 17, 2001

(54) SYSTEM FOR BIDIRECTIONAL TRANSFER OF CONCURRENTLY COMPRESSED DIVIDED GROUPS OF DATA TO BE DISTRIBUTED, CONCURRENTLY EXPANDED, AND COMBINED USING UNIQUE DATA GROUP IDENTIFIERS

(75) Inventor: Norio Kumaki, Tokyo (JP)

(73) Assignee: Advantest Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/976,146

(22) Filed: Nov. 21, 1997

(30) Foreign Application Priority Data

Nov. 22, 1996 (JP) .................................................. 8-312164

(51) Int. Cl.[7] .................................................. G06F 15/16
(52) U.S. Cl. .......................... 709/246; 709/247; 710/20; 710/21; 710/36; 710/52; 710/65; 710/68; 713/150; 707/101
(58) Field of Search .................................. 710/68, 65, 52, 710/36, 20, 21; 395/114; 345/202; 709/246, 247; 713/150; 707/101

(56) References Cited

U.S. PATENT DOCUMENTS

| | | | | |
|---|---|---|---|---|
| 4,929,946 | * | 5/1990 | O'Brien et al. | 341/87 |
| 4,999,715 | * | 3/1991 | Porcellio et al. | 358/433 |
| 5,436,732 | * | 7/1995 | Mikami | 358/444 |
| 5,535,017 | * | 7/1996 | Hideaki | 358/444 |
| 5,572,336 | * | 11/1996 | Mikami et al. | 358/444 |
| 5,764,865 | * | 6/1998 | Masubuchi et al. | 395/114 |
| 5,805,932 | * | 9/1998 | Kawashima et al. | 710/68 |
| 5,854,957 | * | 12/1998 | Morikawa | 399/38 |
| 6,092,071 | * | 7/2000 | Bolan et al. | 707/101 |

* cited by examiner

Primary Examiner—Meng-Ai T. An
Assistant Examiner—Nabil El-Hady
(74) Attorney, Agent, or Firm—Knobbe, Martens, Olson & Bear LLP

(57) ABSTRACT

A system for compressing data and transferring the compressed data between a plurality of apparatus within a short period of time includes a dividing unit for dividing data into a plurality of divided strings of byte data, a compressing unit for concurrently compressing the strings of byte data which have been divided by the dividing unit, an expanding unit for concurrently expanding the compressed strings of byte data which have been transferred, a mixing unit for mixing the divided groups of byte data which have been compressed by the compressing unit, a distributing unit for distributing the groups of byte data which have been mixed by the mixing unit and transferred, and a combining unit for combining the groups of byte data which have been expanded by the expanding unit.

28 Claims, 4 Drawing Sheets

SYSTEM FOR BIDIRECTIONAL TRANSFER OF CONCURRENTLY COMPRESSED DIVIDED GROUPS OF DATA TO BE DISTRIBUTED, CONCURRENTLY EXPANDED, AND COMBINED USING UNIQUE DATA GROUP IDENTIFIERS

BACKGROUND OF THE INVENTION

1. Field of the Invention

The present invention relates to a system and an apparatus for compressing and expanding data, and more particularly to a system and an apparatus for compressing data, transferring the compressed data, and expanding the compressed data into original data.

2. Description of the Related Art

Heretofore, apparatus which exchange data therebetween often incorporate a system for compressing data, transferring the compressed data, and expanding the compressed data into original data in order to reduce the memory size which stores data to be transferred, reduce the amount of data to be transferred, and shorten the period of time required to transfer data.

FIG. 1 of the accompanying drawings shows a conventional data compressing and expanding system for transferring data between two apparatus 110a, 110b. The apparatus 110a, 110b have respective compressing units 111a, 111b for compressing data to be transferred, and respective expanding units 112a, 112b for expanding compressed data that have been transferred. The conventional data compressing and expanding system includes a storage 120 connected between the apparatus 110a, 110b for temporarily storing transferred data. While data is shown as being transferred between the two apparatus in the conventional data compressing and expanding system, data may be transferred between a plurality of apparatus.

Data processing operation of the conventional data compressing and expanding system will be described below with reference to FIGS. 1 and 2 of the accompanying drawings. It is assumed that data will be transferred from the apparatus 110a to the apparatus 110b.

First, a string of byte data to be transferred is compressed into a compressed string of byte data by a compression processor or compression software in the compressing unit 111a.

The compressed string of byte data is sent from the compressing unit 111a to the storage 120, and temporarily stored in the storage 120.

Thereafter, the stored compressed string of byte data is read out of the storage 120, and transferred to the apparatus 110b. The compressed string of byte data may not be stored in the storage 120, but may be transferred directly to the apparatus 110b.

The compressed string of byte data which has been transferred to the apparatus 110b is expanded by an expansion processor or expansion software in the expanding unit 112b, thereby recovering the uncompressed string of byte data.

Most of the time required for the conventional data compressing and expanding system to transfer data is spent by compressing and expanding the data. There are limitations on efforts to reduce the time needed to compress and expand data. Since it is difficult to shorten the time required to transfer data, the time required to transfer data tends to increase if the amount of data to be transferred increases.

SUMMARY OF THE INVENTION

It is therefore an object of the present invention to provide a system and an apparatus for compressing and expanding data to shorten a period of time required to transfer the compressed data.

According to the present invention, when data is divided into a plurality of strings of byte data by dividing means, the divided strings of byte data are concurrently compressed by compressing means and transferred from one apparatus to another apparatus. Thereafter, the strings of byte data which have been transferred are concurrently expanded by expanding means, thus restoring the uncompressed strings of byte data.

Since the divided strings of byte data are concurrently compressed and expanded, the time required to transfer the data is shortened.

The above and other objects, features, and advantages of the present invention will become apparent from the following description with references to the accompanying drawings which illustrate an example of the present invention.

DETAILED DESCRIPTION OF THE PREFERRED EMBODIMENT

Figure 1:
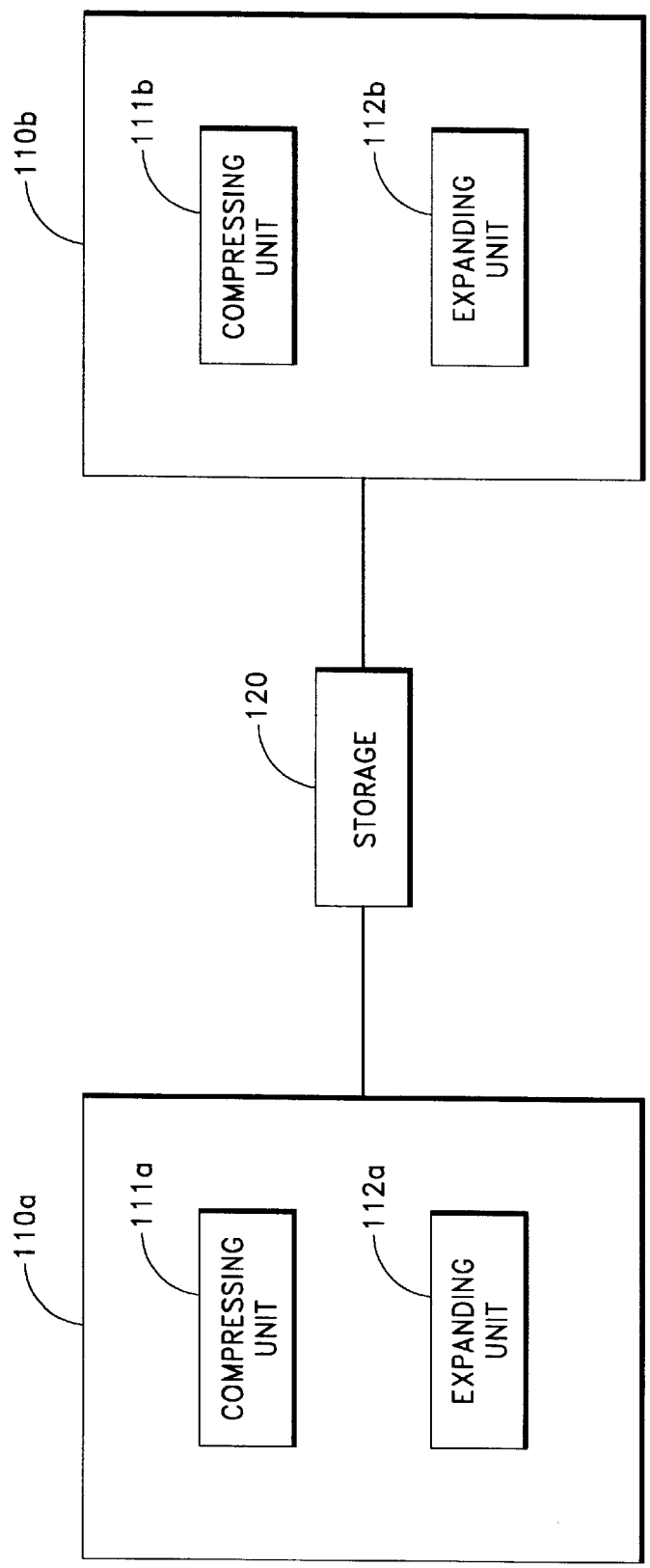
FIG. 1 is a block diagram of a conventional data compressing and expanding system.
Figure 2:
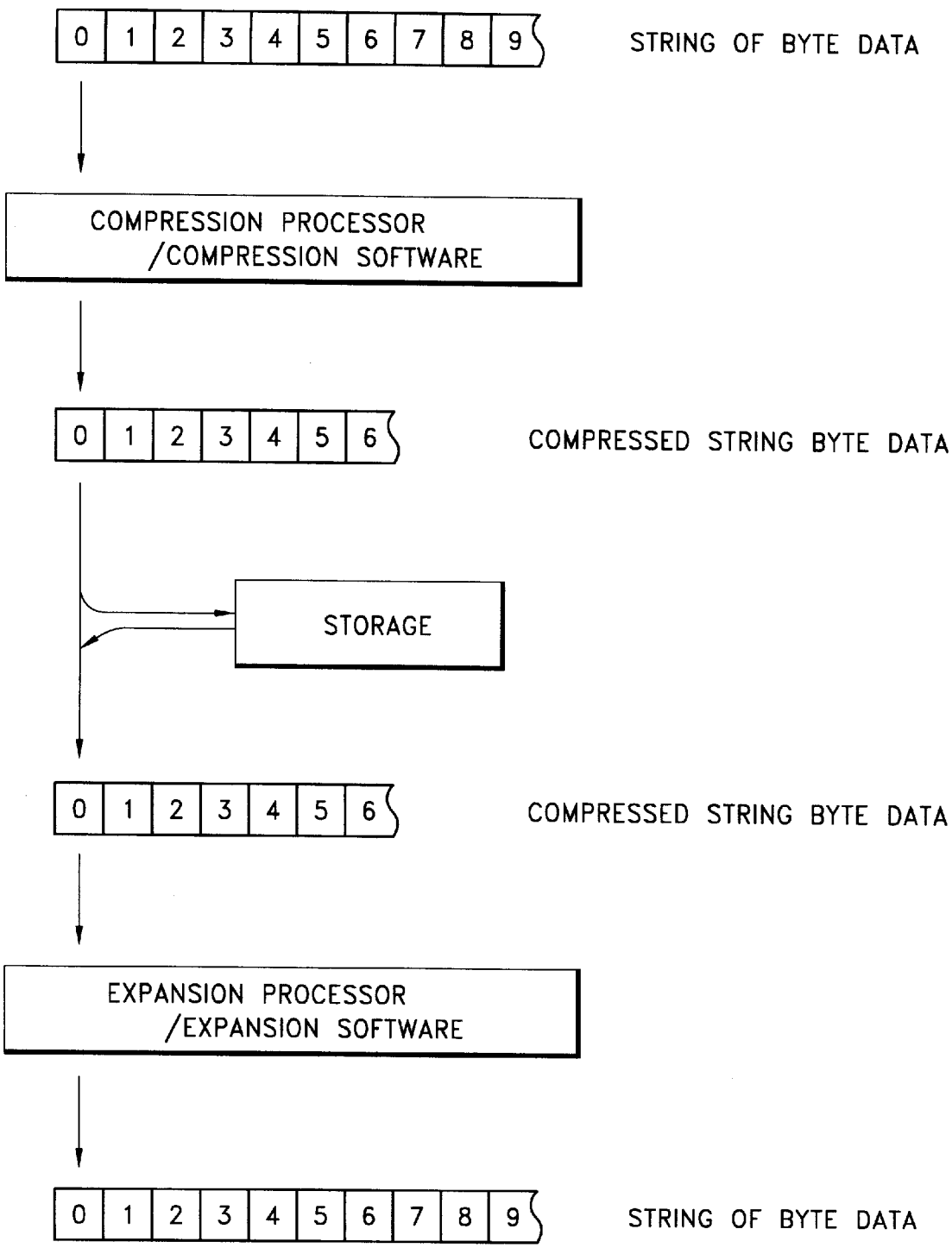
FIG. 2 is a diagram showing a data processing sequence of the conventional data compressing and expanding system shown in FIG. 1.
Figure 3:
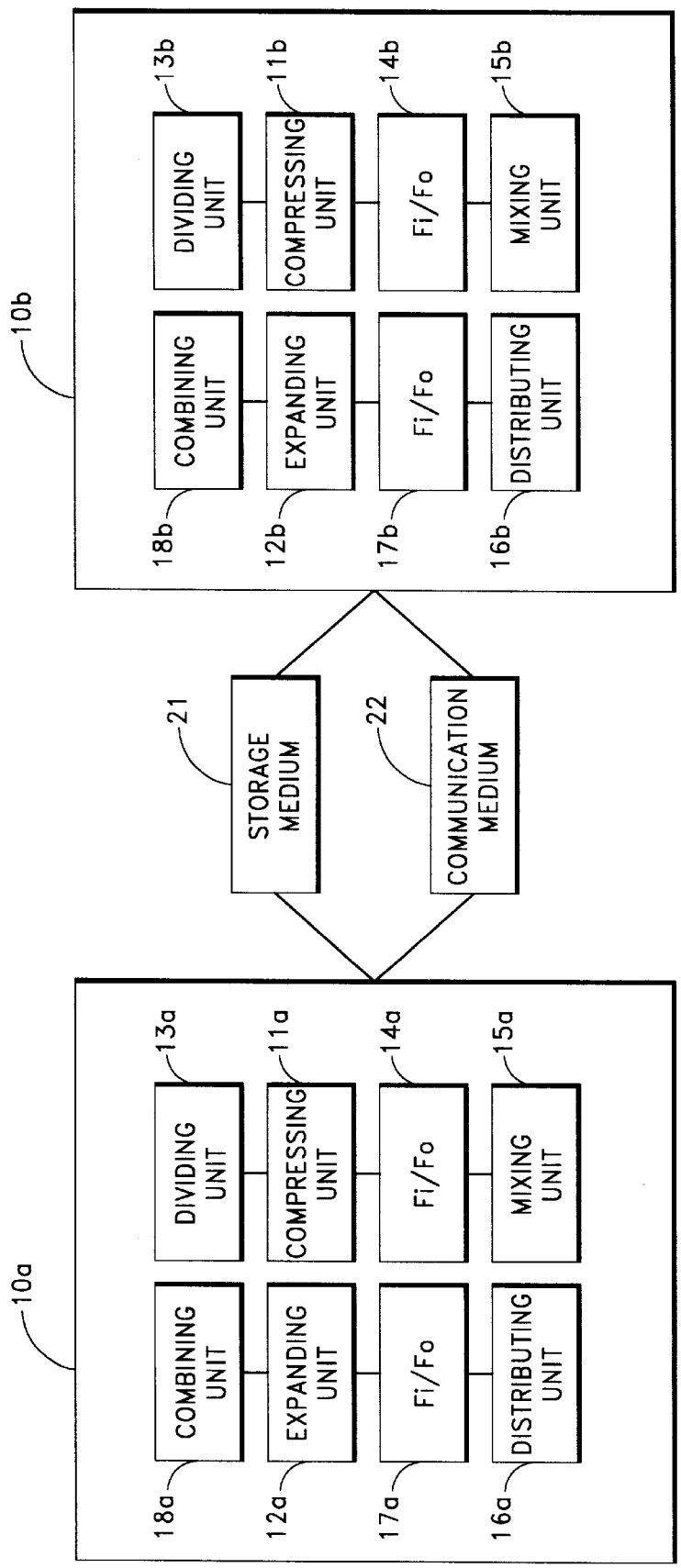
FIG. 3 is a block diagram of a data compressing and expanding system according to the present invention.

FIG. 3 shows in block form a data compressing and expanding system according to the present invention.

As shown in FIG. 3, the data compressing and expanding system transfers data between two apparatus 10a, 10b. The apparatus 10a, 10b have respective dividing units 13a, 13b for dividing data to be transferred, respective compressing units 11a, 11b for compressing the data divided by the dividing units 13a, 13b, respective Fi/Fo (First-in, First-out) storage units 14a, 14b for temporarily storing the data compressed by the compressing units 11a, 11b, respective mixing units 15a, 15b for reading and mixing the data stored in the Fi/Fo storage units 14a, 14b, respective distributing units 16a, 16b for distributing transferred data, respective Fi/Fo storage units 17a, 17b for temporarily storing the data distributed by the distributing units 16a, 16b, respective expanding units 12a, 12b for reading the stored data from the Fi/Fo storage units 17a, 17b and expanding the read data, and respective combining units 18a, 18b for combining the data expanded by the expanding units 12a, 12b.

Data is transferred between the apparatus 10a, 10b through either a storage medium 21 which stores the transferred data or a communication medium 22 that interconnects the apparatus 10a, 10b. While data is shown as being transferred between the two apparatus 10a, 10b, data may be transferred between a plurality of apparatus.

Figure 4:
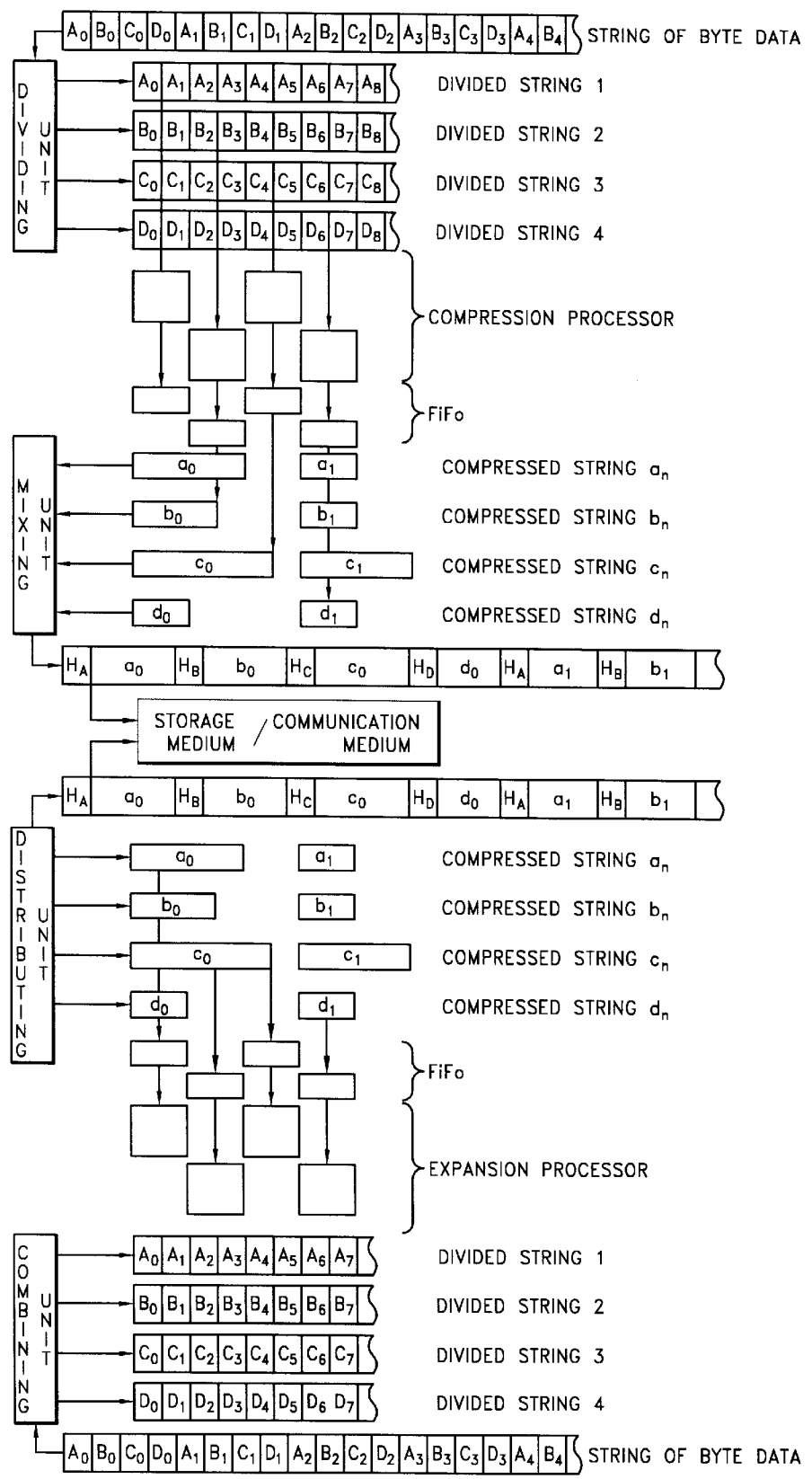
FIG. 4 is a diagram showing a data processing sequence of the data compressing and expanding system shown in FIG. 3.

A data processing sequence of the data compressing and expanding system will be described below with reference to FIGS. 3 and 4. It is assumed that data is transferred from the apparatus 10a to the apparatus 10b.

A string of byte data to be transferred is divided into a plurality of strings of N bytes by the dividing unit 13a. In the illustrated embodiment, as shown in FIG. 4, a string of byte data An, Bn, Cn, Dn (n=0, 1, 2, . . . ) is divided into four divided strings 1~4 of byte data.

The divided strings 1~4 of byte data from the dividing unit 13a are then compressed by compression processors or compression software in the compressing unit 11a, and the compressed strings an, bn, cn, dn of byte data are outputted and stored in the Fi/Fo storage unit 14a. At this time, the divided strings 1~4 of byte data are concurrently compressed by the compressing unit 11a.

Then, the compressed strings an, bn, cn, dn of byte data are read from the Fi/Fo storage unit 14a, and supplied to the mixing unit 15a, which adds headers HA, HB, HC, HD as identifiers for identifying the compressed strings an, bn, cn, dn of byte data, respectively, to the compressed strings an, bn, cn, dn of byte data, and mixes the compressed strings an, bn, cn, dn of byte data and the added headers HA, HB, HC, HD.

Thereafter, the compressed strings an, bn, cn, dn of byte data which are mixed with the headers HA, HB, HC, HD added thereto are transferred through the storage medium 21 or the communication medium 22 to the apparatus 10b.

When the compressed strings an, bn, cn, dn of byte data with the headers HA, HB, HC, HD added thereto reach the apparatus 10b, the distributing unit 16b distributes the compressed strings an, bn, cn, dn of byte data based on the added headers HA, HB, HC, HD, and outputs the compressed strings an, bn, cn, dn of byte data to the Fi/Fo storage unit 17b, where they are stored.

The expanding unit 12b then reads the compressed strings an, bn, cn, dn of byte data from the Fi/Fo storage unit 17b, and expands the compressed strings an, bn, cn, dn of byte data back into the divided strings 1~4 of byte data. At this time, the compressed strings an, bn, cn, dn of byte data are concurrently expanded into the divided strings 1~4 of byte data by the expanding unit 12b.

Subsequently, the combining unit 18b combines the divided strings 1~4 of byte data expanded by the expanding unit 12b, thereby recovering the uncompressed string of byte data in the apparatus 10a.

While a preferred embodiment of the present invention has been described using specific terms, such description is for illustrative purposes only, and it is to be understood that changes and variations may be made without departing from the spirit or scope of the following claims.

What is claimed is:

1. A data transfer system functioning in bidirectional flow of data for compressing data and transferring the compressed data between a plurality of apparatus, said system comprising:

dividing means for dividing data into a plurality of divided groups of data;

compressing means for concurrently compressing the plurality of divided groups of data;

transferring means for transferring the compressed plurality of divided groups of data from a selected one apparatus to a selected other apparatus, wherein each of the compressed plurality of divided groups of data includes an identifier, each identifier uniquely identifying a particular group of data in the transferred compressed plurality of divided groups of data;

distributing means for distributing the compressed plurality of divided groups of data and the identifiers which have been transferred, said distributing is based on said identifiers; and expanding means for concurrently expanding the compressed plurality of divided groups of data which have been transferred from the selected other apparatus to the selected one apparatus.

2. A system according to claim 1, further comprising:

identifier adding means for adding each identifier to the divided groups of data which have been concurrently compressed by said compressing means; and combining means for combining the plurality of divided groups of data which have been concurrently expanded by said expanding means.

3. A system according to claim 2, wherein said identifier adding means includes means for placing the added identifiers before the groups of data which have been concurrently compressed by said compressing means, and said distributing means includes means for distributing the transferred groups of data based on said identifiers.

4. A system according to claim 3, further comprising a storage medium connected between the plurality of apparatus for storing the plurality of divided groups of data for transfer between the plurality of apparatus.

5. A system according to claim 3, further comprising a communication medium connected between the plurality of apparatus for transferring the plurality of divided groups of data therethrough between the plurality of apparatus.

6. A system according to claim 2, further comprising a storage medium connected between the plurality of apparatus for storing the plurality of divided groups of data for transfer between the plurality of apparatus.

7. A system according to claim 2, further comprising a communication medium connected between the plurality of apparatus for transferring the plurality of divided groups of data therethrough between the plurality of apparatus.

8. A system according to claim 1, further comprising a storage medium connected between the plurality of apparatus for storing the plurality of divided groups of data for transfer between the plurality of apparatus.

9. A system according to claim 1, further comprising a communication medium connected between the plurality of apparatus for transferring the plurality of divided groups of data therethrough between the plurality of apparatus.

10. A data transfer system functioning in bidirectional flow of data for compressing data and transferring the compressed data between a plurality of apparatus, said system comprising:

dividing means for dividing data into a plurality of divided groups of byte data;

compressing means for concurrently compressing the plurality of divided groups of byte data which have been divided by said dividing means;

transferring means for transferring the compressed plurality of divided groups of byte data from a selected one apparatus to a selected other apparatus, wherein each of the compressed plurality of divided groups of byte data includes an identifier, each identifier uniquely identifying a particular group of byte data in the transferred compressed plurality of divided groups of byte data;

distributing means for distributing the compressed plurality of divided groups of byte data and the identifiers which have been transferred, said distributing is based on said identifiers;

expanding means for concurrently expanding the compressed groups of byte data which have been transferred from the selected other apparatus.

11. A system according to claim 10, further comprising:

identifier adding means for adding each identifier to the divided groups of byte data which have been concurrently compressed by said compressing means; and combining means for combining the plurality of divided groups of byte data which have been concurrently expanded by said expanding means.

12. A system according to claim 11, wherein said identifier adding means includes means for placing the added identifiers before the groups of byte data which have been concurrently compressed by said compressing means, and said distributing means includes means for distributing the transferred groups of byte data based on said identifiers.

13. A system according to claim 12, further comprising a storage medium connected between the plurality of apparatus for storing the plurality of divided groups of byte data for transfer between the plurality of apparatus.

14. A system according to claim 12, further comprising a communication medium connected between the plurality of apparatus for transferring the plurality of divided groups of byte data therethrough between the plurality of apparatus.

15. A system according to claim 11, further comprising a storage medium connected between the plurality of apparatus for storing the plurality of divided groups of byte data for transfer between the plurality of apparatus.

16. A system according to claim 11, further comprising a communication medium connected between the plurality of apparatus for transferring the plurality of divided groups of byte data therethrough between the plurality of apparatus.

17. A system according to claim 10, further comprising a storage medium connected between the plurality of apparatus for storing the plurality of divided groups of byte data for transfer between the plurality of apparatus.

18. A system according to claim 10, further comprising a communication medium connected between the plurality of apparatus for transferring the plurality of divided groups of byte data therethrough between the plurality of apparatus.

19. A first apparatus for compressing data to be transferred to a second apparatus and expanding data transferred from either said second apparatus or a third apparatus in a data transfer system functioning in bidirectional flow of data, said first apparatus comprising:

dividing means for dividing data into a plurality of divided groups of data;

compressing means for concurrently compressing the plurality of divided groups of data;

identifier adding means for adding an identifier to each of the plurality of divided groups of data which have been concurrently compressed by said compressing means;

distributing means for distributing the compressed plurality of divided groups of data and the identifiers which have been transferred, said distributing is based on said identifiers; and expanding means for concurrently expanding the compressed plurality of divided groups of data which have been transferred from either said second apparatus or said third apparatus.

20. The first apparatus according to claim 19, further comprising:

combining means for combining the plurality of divided groups of data which have been concurrently expanded by said expanding means.

21. The first apparatus according to claim 20, wherein said identifier adding means includes means for placing the added identifiers before the groups of byte data which have been concurrently compressed by said compressing means, and said distributing means includes means for distributing the transferred groups of data based on said identifiers.

22. A first apparatus for compressing data to be transferred to a second apparatus and expanding data transferred from either said second apparatus or a third apparatus in a data transfer system functioning in bidirectional flow of data, said first apparatus comprising:

dividing means for dividing data into a plurality of divided groups of byte data;

compressing means for concurrently compressing the plurality of divided groups of byte data;

identifier adding means for adding an identifier to each of the plurality of divided groups of byte data which have been concurrently compressed by said compressing means;

distributing means for distributing the compressed plurality of divided groups of byte data and the identifiers which have been transferred, said distributing is based on said identifiers; and expanding means for concurrently expanding the compressed plurality of divided groups of byte data which have been transferred from either said second apparatus or said third apparatus.

23. The first apparatus according to claim 22, further comprising:

combining means for combining the plurality of divided groups of byte data which have been concurrently expanded by said expanding means.

24. The first apparatus according to claim 23, wherein said identifier adding means includes means for placing the added identifiers before the groups of byte data which have been concurrently compressed by said compressing means, and said distributing means includes means for distributing the transferred groups of byte data based on said identifiers.

25. An apparatus in a data transfer system functioning in bidirectional flow of data, said apparatus comprising:

dividing means for dividing data into a plurality of divided groups of data;

compressing means for concurrently compressing the plurality of divided groups of data;

identifier adding means for adding an identifier to each of the plurality of divided groups of data which have been concurrently compressed by said compressing means for transferring to another apparatus, each identifier uniquely identifying a particular group of plurality of divided groups of data; and distributing means for distributing the compressed plurality of divided groups of data and the identifiers which have been transferred, said distributing is based on said identifiers in the transferred compressed data.

26. An apparatus in a data transfer system functioning in bidirectional flow of data, said apparatus comprising:

identifier adding means for adding an identifier to each of a plurality of divided groups of data which have been concurrently compressed for transferring to another apparatus, each identifier uniquely identifying a particular group of data in the transferred compressed plurality of divided groups of data;

distributing means for distributing the compressed plurality of divided groups of data which have been transferred from said another apparatus to apparatus, said distributing is based on said added identifiers;

expanding means for concurrently expanding the compressed plurality of divided groups of data which have been transferred from said another apparatus to said apparatus; and combining means for combining the plurality of divided groups of data which have been concurrently expanded by the expanding means, the expanded plurality of divided groups of data directly corresponding to groups of data from which the compressed plurality of divided groups of data have been generated by said another apparatus.

27. An apparatus in a data transfer system functioning in bidirectional flow of data, comprising:

a dividing unit receiving inputted data and outputting groups of divided data;

a compressing unit concurrently receiving the groups of divided data from the dividing unit and concurrently outputting compressed groups of divided data;

an identifier adding unit receiving the compressed groups of divided data from the compressing unit and outputting compressed groups of divided data and added identifiers to a storage medium or a communication medium, each identifier uniquely identifying a particular group of groups of divided data; and a distributing unit receiving the compressed groups of divided data and added identifiers from the storage medium or the communication medium and outputting compressed groups of divided data based on the added identifier in the transferred compressed data.

28. An apparatus in a data transfer system functioning in bidirectional flow of data, comprising:

an identifier adding unit receiving compressed groups of divided data and outputting compressed groups of divided data and identifiers to a storage medium or a communication medium, each identifier uniquely identifying a particular group of data in the transferred compressed groups of divided data;

a distributing unit receiving the compressed groups of divided data and added identifiers from the storage medium or the communication medium and outputting compressed groups of divided data based on the added identifier;

an expanding unit concurrently receiving the compressed groups of divided data from the distributing unit and concurrently outputting expanded groups of divided data; and a combining unit receiving the expanded groups of divided data from the expanding unit and outputting combined groups of data, the expanded groups of divided data directly corresponding to groups of data from which the compressed groups of divided data have been generated by said another apparatus.

\* \* \* \* \*